United States Patent [19]

Saiki et al.

[11] 4,218,283

[45] Aug. 19, 1980

[54] METHOD FOR FABRICATING SEMICONDUCTOR DEVICE AND ETCHANT FOR POLYMER RESIN

[75] Inventors: Atsushi Saiki, Musahimurayama; Toshio Okubo, Tokyo; Seiki Harada, Hachioji, all of Japan

[73] Assignee: Hitachi, Ltd., Japan

[21] Appl. No.: 924,008

[22] Filed: Jul. 12, 1978

Related U.S. Application Data

[63] Continuation-in-part of Ser. No. 695,040, Jun. 11, 1976, Pat. No. 4,113,550, which is a continuation-in-part of Ser. No. 607,562, Aug. 25, 1975, abandoned.

[30] Foreign Application Priority Data

Aug. 23, 1974 [JP] Japan ............................. 49/96157
Aug. 13, 1975 [JP] Japan ............................. 50/98179

[51] Int. Cl.² ................. H01L 7/00; C09K 13/00; C23F 1/00
[52] U.S. Cl. ............................. 156/656; 156/659; 156/664; 156/668; 156/901; 427/96; 252/79.1; 430/311; 430/313; 430/315; 430/318; 430/319
[58] Field of Search ............. 156/654, 668, 901, 659, 156/664, 656; 96/35.1, 36, 36.2, 38.4, 48 R; 427/96; 252/79

[56] References Cited

U.S. PATENT DOCUMENTS

| | | | |
|---|---|---|---|
| 3,395,057 | 7/1968 | Fick | 156/630 |
| 3,700,497 | 10/1972 | Epifano et al. | 427/89 |
| 4,113,550 | 9/1978 | Saiki | 156/664 |

OTHER PUBLICATIONS

Agnihotri et al., IBM Tech. Bulletin, "Solvent Coating", vol. 16, No. 4 (1973) p. 1284.
Loukianott, IBM Tech. Bulletin, Etchant . . . Cured Polyamides, vol. 15, No. 9 (1973) p. 2820.

*Primary Examiner*—Michael F. Esposito
*Attorney, Agent, or Firm*—Craig & Antonelli

[57] ABSTRACT

A semiconductor device fabricated by forming a layer of cured polyimide resin on a semiconductor body, forming a photoresist layer having a prescribed pattern on said cured layer, immersing in an etchant consisting of hydrazine and ethylenediamine to said cured layer through said prescribed pattern, whereby said cured layer is precisely etched according to said prescribed pattern and prescribed surfaces of said semiconductor body are exposed, forming a metal layer on the surface of said polyimide and the prescribed surfaces of said body, and selectively etching said metal layer so as to form a prescribed pattern.

49 Claims, 25 Drawing Figures

FE = w/d

METHOD FOR FABRICATING SEMICONDUCTOR DEVICE AND ETCHANT FOR POLYMER RESIN

This application is a continuation-in-part of Ser. No. 695,040, filed June 11, 1976, now U.S. Pat. No. 4,113,550, issued Sept. 12, 1978, which application Ser. No. 695,040 is a continuation-in-part of Ser. No. 607,562, filed Aug. 25, 1975, now abandoned.

The present invention relates to a method for fabricating a semiconductor device having a polymer resin layer on a surface of a body, and an etchant for a polymer resin layer.

Recently, it has been increased to use a polymer resin having excellent characteristics in an electrical insulation and in a heat resistivity, as an insulating body for wirings in a semiconductor integrated circuit device, a protective film for a large scale integrated circuit device, and an intermediate insulating layer between multi-layered wirings, etc.

As the polymer resin, it has been utilized a thermoplastic polymer resin, such as Teflon and a copolymer of fluorinated ethylene/propylene, etc., and a thermosetting polymer resin, such as resins of polyimide, epoxy, phenol, polycarbonate, polyamide, polybenzimidazole types and a resin of polyimide-isoindroquinazolinedione (this is described as PIQ hereinafter), etc. Among these polymer resins, it has been recognized that to use the polyimide resin and the PIQ resin for semiconductor devices are preferable and especially to use the PIQ resin is more preferable.

The polyimide resin is well known in the art, and has a chemical formula shown by:

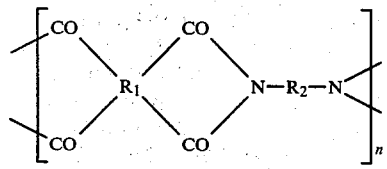

wherein $R_1$ and $R_2$ represent radicals of a tetravalent aromatic group and of a divalent aromatic group, respectively, and n is a positive integer. This polyimide resin is prepared by synthesizing an aromatic diamine and an aromatic acid dianhydride, and is usually formed by utilizing Pyre-ML (Trade name of E. I. du Pont de Nemours and Company) or Torayniece (Trade name of Toray Kabushikikaisha), for example.

The polyimide resin and its preparing process are described in detail in U.S. Pat. No. 3,179,634 assigned to E. I. du Pont de Nemours and Company, and its application to the semiconductor devices is described, for example in U.S. Pat. No. 3,700,497 assigned to RCA Corporation.

The PIQ resin is commonly known in the art, and has a chemical formula shown by:

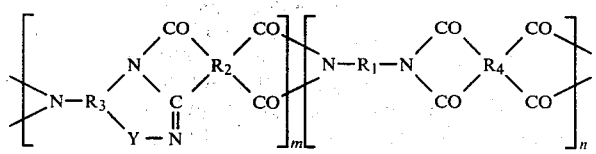

wherein $R_1$, $R_2$, $R_3$ and $R_4$ are selected from aromatic multivalent groups, m and n are positive integers and Y is —CO— or —SO$_2$—. This PIQ resin is prepared by reacting an aromatic diamine, an aromatic acid dianhydride and an aromatic carbon amide, etc.

The PIQ resin and its fabricating process are disclosed in Japanese Pat. No. 702,696 (Japanese Patent Publication No. 48-2956) assigned to Hitachi, Ltd., and its application to the semiconductor devices is described, for example, in United States Patent Application Ser. No. 407,447.

In these semiconductor devices utilizing polyimide resin layers or PIQ resin layers as the protective films or as the intermediate insulating layers, it has been required to make minute openings through the polyimide resin layers and through the PIQ resin layers for making electric contacts densely, thereby increasing an integrating density of semiconductor circuit elements.

Methods for making openings through the polyimide resin layers are described, for example, in U.S. Pat. No. 3,700,497 and in U.S. Pat. No. 3,395,057 assigned to G. T. Schjeldahl Company.

According to the method described in U.S. Pat. No. 3,700,497, openings are formed by the steps of forming a film of polyamide acid which is a prepolymer of polyimide on a surface of a body, forming a photoresist layer on said film, exposing the photoresist with a masking pattern which defines positions where openings through the polyimide layer are desired, removing the photoresist and underlying the polyamide acid film at said positions to provide the openings utilizing a developer for the photoresist, and curing the remainder of the polyamide acid film by heating. Concretely speaking, the openings are formed by the steps of coating a solution consisting of polyamide acid, and N-methyl-2-pyrrolidone or dimethyl acetamide, drying the coating at about 82° C. for 3 minutes for obtaining a film of polyamide acid, applying a layer of photoresist, such as AZ 1300 marketed by the Shipley Company, over the polyamide acid film, baking the resultant device at about 82° C. for 15 minutes, placing a positive masking pattern on top of the layer of baked photoresist, exposing the pattern using ultraviolet light, developing the photoresist with a developer which is alkaline and has ability to dissolve the polyamide acid, whereby the parts of the photoresist layer which were exposed to ultraviolet light are removed and also the parts of the polyamide acid film directly beneath the removed parts of the photoresist layer are removed dissolving the photoresist in acetone, and curing the remainder of polyamide acid film at about 510° C. for about 10 minutes.

According to the method described in U.S. Pat. No. 3,395,057, openings are formed by the steps of forming a film of polyimide, such as the code name "Kapton-H" which is commercially available from E. I. du Pont de Nemours and Company, on a surface of a body, forming a film of photoresist, such as the code name "KPR" available from Eastman Kodak Company, on the polyimide film, forming desired patterns in the photoresist film by exposing photoresist and removing exposed photoresist, so as to expose the surface of the polyimide film, and subjecting the exposed surface of the polyimide film to an etchant consisting essentially of hydrazine.

In these conventional methods, there are disadvantages such that, in the former method, it is very difficult to obtain an opening having a diameter of less than several ten μm, and to obtain good edge definition of the opening, since the polyamide acid is baked at about 82° C. for 3 minutes, and hence a solvent for the polyamide acid, such as N-methyl-2-pyrrolidone whose boiling point is 202° C. or dimethyl acetamide whose boiling point is 167° C., is not completely evaporated; and in the latter method, the edge definition of the opening and the reproducibility of the opening are worse when compared with those of the former method, and also it is very difficult to obtain the opening having a diameter of less than about 100 μm.

It is, therefore, an object of the present invention to provide a method for fabricating a semiconductor device having a polymer resin layer in which an opening whose diameter is in the order of several microns.

Another object of the present invention is to provide a method for fabricating an opening having a diameter in the order of several microns, which is required for semiconductor devices, through a polymer resin layer.

A further object of the present invention is to provide an etchant suitable for making openings through polymer resin layers.

The above objects are attained by utilizing an etchant consisting essentially of hydrazine and polyamine shown by a chemical formula of:

wherein R is selected from divalent radicals having 2–6 carbon atoms, for forming openings through the polymer resin layers.

In the present invention, it is preferable to form openings through the polymer resin layer in a semicured stage which is attained by a heat treatment of the prepolymer of the polymer resin at a temperature ranging from about 200° C. to about 250° C. for a time period between several minutes and several hours.

Further, the polymer resin to be etched according to the present invention should be selected from the group consisting of polymer resins having therein imide groups, amide groups and both the groups, since it is considered by the present inventors that the etching mechanism of the present invention is that hydrazine in the etchant first reacts on the polymer resin, whereby the polymer resin is decomposed to compounds which can be dissolved in polyamine solution. Typical polymer resins having therein imide groups, amide groups and both the groups are, respectively, polyimide resins and PIQ resins, polyamide resins, and polyamide-imide resins.

The additional objects and advantages of the present invention will become apparent from the following description when taken in conjunction with the accompanying drawings, wherein:

FIG. 1 shows results of experiments wherein several etchants were effected onto polyimide type intermediary films, which are semicured PIQ films and which were cured at 220° C., and thicknesses of the films were measured at every time period.

Figure 1:
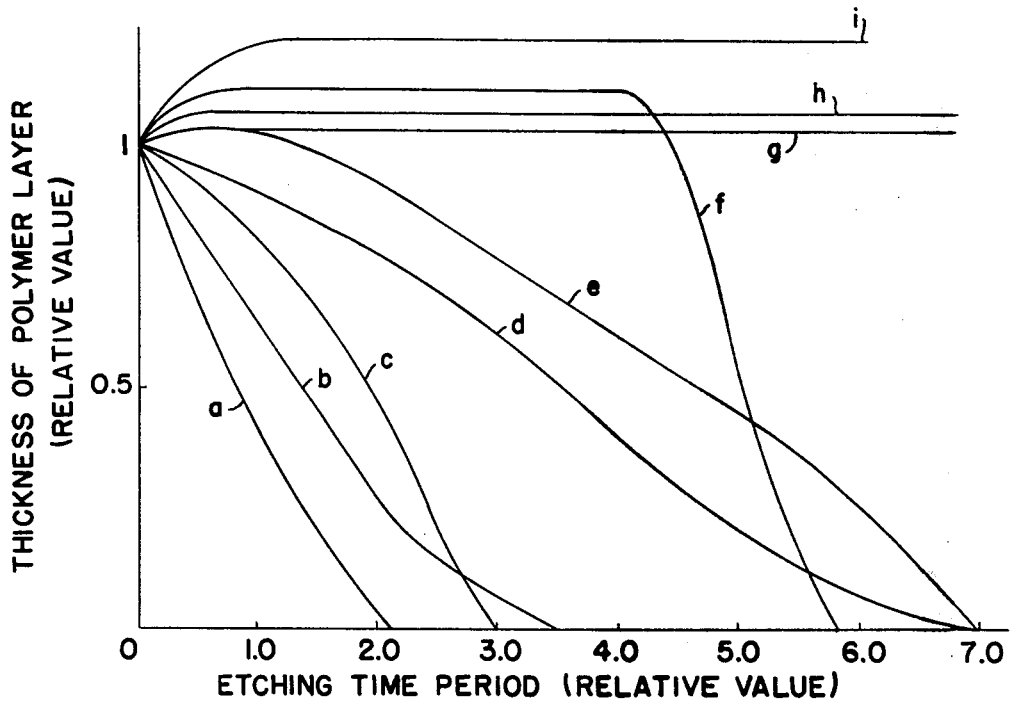
FIG. 1 is a graph showing etching characteristics of several etchants.

In FIG. 1, curves show changes of thicknesses of the films; that is, curves a, b, c, d and e are for etchants of the present invention and curves f, g, h and i are for other etchants. The films are etched, as shown by the curves a, b, c, d, e, f, g, h and i, when etchants consisting essentially of hydrazine hydrate (80% aqueous solution) and ethylenediamine, $NH_2.CH_2CH_2.NH_2$; of hydrazine hydrate (80% aqueous solution) and trimethylenediamine, $NH_2.(CH_2)_3.NH_2$; of hydrazine hydrate (80% aqueous solution) and hexamethylenediamine, $NH_2.(CH_2)_6.NH_2$; of hydrazine hydrate (80% aqueous solution) and diethylenetriamine, $NH_2.(CH_2.CH_2.NH).CH_2.CH_2.NH_2$; of hydrazine hydrate (80% aqueous solution) and triethylenetetramine, $(NH_2.CH_2.CH_2.NH.CH_2)_2$; of hydrazine hydrate (80% aqueous solution), and n-buthylamine, $(C_4H_9)NH_2$; of hydrazine hydrate (80% aqueous solution) and triethylamine, $(C_2H_5)_3N$; and of hydrazine hydrate (80% aqueous solution) and triethanolamine $(C_2H_4OH)_3N$ are utilized, respectively. In these etchants, a volume ratio between hydrazine hydrate (80% aqueous solution) and the other constituent is 2:3.

Figure 2A:
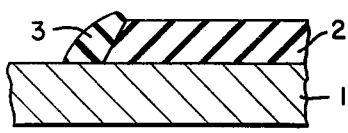
FIGS. 2a and 2b are sectional views of PIQ films etched by different etchants each other.

When hydrazine hydrate (80% aqueous solution), for example, is utilized as the etchant, the film swells due to the penetration of hydrazine into the film, and the thickness of the film increases about 10% of the initial thickness. It is believed by the inventors that an etching mechanism of this hydrazine hydrate is that, during the swelling, imide bonds are divided into many polyimide molecules and the polyimide molecules being less than a certain molecular weight dissolve into the hydrazine solution. Therefore, regions of the swelling from which molecules dissolve remain at peripheries of etched openings. This state is shown in FIG. 2a which is a sectional view of PIQ film 2 disposed on a body 1, and which is observed after forming PIQ film 2 on the body 1, forming a photoresist having a pattern therein on PIQ film 2, etching PIQ film 2 by the etchant of hydrazine hydrate (80% aqueous solution) and removing the photoresist. A swelled portion 3 caused by the swelling of PIQ film was clearly recognized at the periphery of the opening. This swelled portion 3 causes several disadvantages in semiconductor devices. For example, in semiconductor devices having multi-level interconnections, the swelled portion not only becomes obstacles for a fabrication of second conductive wirings, but also reduces a thermal stability and a reliability of the device.

Figure 2B:
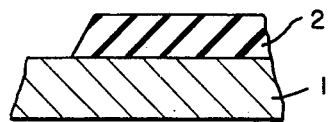

On the other hand, when the etchant consisting of hydrazine hydrate (80% aqueous solution) and ethylenediamine, for example, is utilized, none of the swelled portions are observed at the periphery of the opening, and the thickness of PIQ film reduces in nearly proportion to the time period. A sectional view of PIQ film disposed on a body is shown in FIG. 2b and which was etched by the etchant consisting of hydrazine hydrate (80% aqueous solution) and ethylenediamine. As apparent from FIG. 2b, PIQ film 2 on the body 1 is etched so that the side wall of PIQ film 2 has a nearly straight inclination, and no swelled portions are recognized at the periphery of the opening. This shape of the opening is very desirable for the semiconductor devices. In the semiconductor devices having multi-level interconnections, for example, a trouble of a snapping of a conductive wiring at a step of PIQ film does not take place.

As is apparent from FIG. 1, not only the etchant consisting of hydrazine hydrate and ethylenediamine, but also the etchant consisting of hydrazine hydrate and trimethylenediamine; of hydrazine hydrate and hexamethylenediamine; of hydrazine hydrate and diethylenetriamine; or of hydrazine hydrate and triethylenetetramine can be utilized for etching polymer resins, though a very little swelled portion is caused when the etchant consisting of hydrazine hydrate and triethylenetetramine is utilized.

According to the experiments of the present inventors, the openings suitable for the semiconductor devices can be formed through polymer resin layer by utilizing the etchant consisting essentially of hydrazine and polyamine shown by a chemical formula of:

$$NH_2.R.NH_2,$$

wherein R is a divalent radical selected from divalent radicals having 2-6 carbon atoms. A preferable radical is selected from diamine, $(CH_2)_n$, wherein n is an integer more than 2 inclusive. That is, preferable polyamines are:

| ethylenediamine | $NH_2 . CH_2 . CH_2 . NH_2,$ |
|---|---|
| trimethylenediamine | $NH_2 . (CH_2)_3 . NH_2,$ |
| tetramethylenediamine | $NH_2 . (CH_2)_4 . NH_2,$ |
| pentamethylenediamine | $NH_2 . (CH_2)_5 . NH_2,$ and |
| hexamethylenediamine | $NH_2 . (CH_2)_6 . NH_2.$ |

An etching rate of a polymer resin film by the etchant consisting of hydrazine hydrate and ethylenediamine depends on a semicuring temperature of the polymer resin, a volume % of ethylenediamine in the etchant and a temperature of the etchant.

The semicuring temperature should be higher than a boiling temperature of a solvent for the polymer resin, since, when the semicuring temperature is lower than the boiling temperature of the solvent, the evaporation of the solvent is incomplete, and hence the etching accuracy is not so high.

When the polymer resin film may be etched at the sacrifice of a long time period of the etching, the etching may be done after the polymer resin is completely polymerized. However, when the polymer resin film should be etched accurately within a desired short time period, it is preferable that the semicuring temperature should be lower than about 250° C., since, when the semicuring temperature is higher than about 250° C., the polymer resin film is polymerized and a bridge structure is formed in the polymer resin film, and hence the etching period becomes long.

For the PIQ resin film and the polyimide resin film, it is preferable that the semicuring temperature should be between about 200° C. and about 250° C., since the boiling temperature of the solvent is high (for example, the boiling temperatures of N-methyl-2-pyrrolidone and of N,N-dimethylacetoamide are 202° C. and 167° C., respectively).

Figure 3:
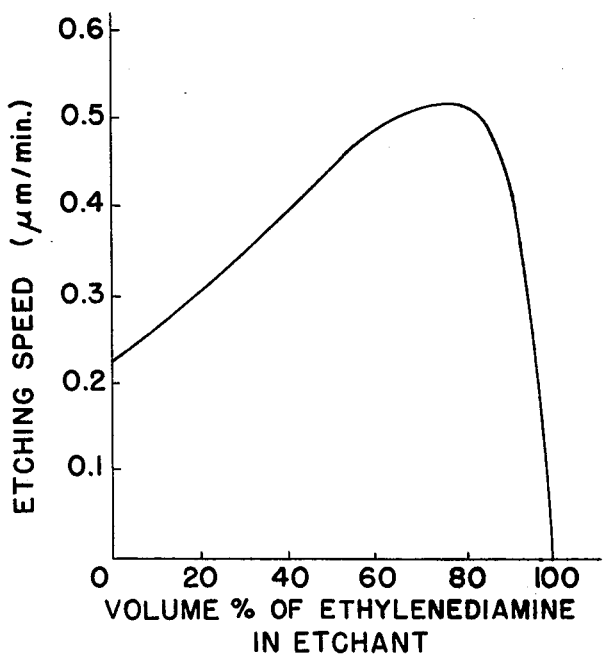
FIG. 3 is a graph showing a relation between an etching speed and a volume % of one constituent in the etchant of the present invention.

FIG. 3 shows a relation between the etching rate and the volume % of ethylenediamine in the etchant.

As is apparent from FIG. 3, the etching rate depends on the volume % of ethylenediamine and the etching rate becomes highest when the volume % of ethylenediamine is between 60% and 85% in the etchant. The etching rate by the etchant consisting of hydrazine is about a half of that by the etchant consisting essentially of hydrazine and ethylenediamine wherein the volume % of ethylenediamine is between about 50% and about 90%.

It is preferable to set the temperature of the etchant between about 20° C. and about 30° C. When the etchant temperature is lower than about 20° C., the etching time period becomes long and when the etchant temperature is higher than about 30° C., the etching rate becomes too high to control the etching accuracy, and it is observed that the periphery of the polymer resin film swells due to an activation of the hydrazine.

Accuracy of an opening size is attained by controlling the polymerizing temperature, the etchant temperature and the volume % of ethylenediamine in the etchant.

The preferable ranges of the polymerizing temperature and the etchant temperature were already described. The preferable range of the volume % of ethylenediamine in the etchant is determined by experiments.

Figure 4:
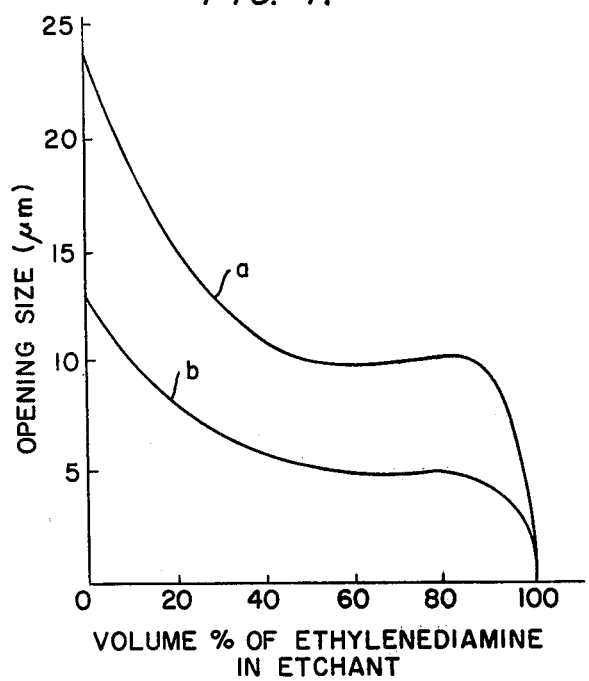
FIG. 4 is a graph showing a relation between an opening size and a volume % of one constituent in the etchant of the present invention.

FIG. 4 is a graph showing a relation between a size of the opening which is measured after etching the PIQ resin film and the volume % of ethylenediamine. In FIG. 4, curves a and b show the opening size measured after steps of forming photoresist layers having patterns of 10 μm and 5 μm on the PIQ resin films and etching the PIQ resin films by the etchant, respectively.

As apparent from FIG. 4, it is preferable to utilize the etchant whose volume % of ethylenediamine is between about 50% and about 90% for obtaining the opening size which is almost same as the pattern size formed on the photoresist layer, and it is more preferable to utilize the etchant whose volume % of ethylenediamine is between about 60% and 85%. When the etchant consisting of hydrazine is utilized, the shape of the opening becomes nearly circular, which is different from the shape of the pattern formed on the photoresist which is square.

Figure 5:
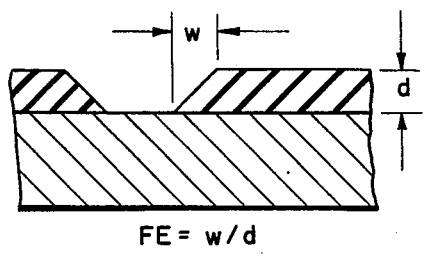
FIG. 5 is a sectional view of a polymer resin film for explaining an etching factor.

The etchant of the present invention has such a further advantage that the etching factor $F_E$ can be controlled by changing the volume % of ethylenediamine in the etchant. The etching factor $F_E$ is defined by:

$$F_E = w/d,$$

wherein d is a thickness of the polymer resin film to be etched and w is a width of a slope portion as shown in FIG. 5 which is a sectional view of a polymer resin film. This etching factor changes as shown in FIG. 6 according to the volume % of ethylenediamine in the etchant.

Figure 6:
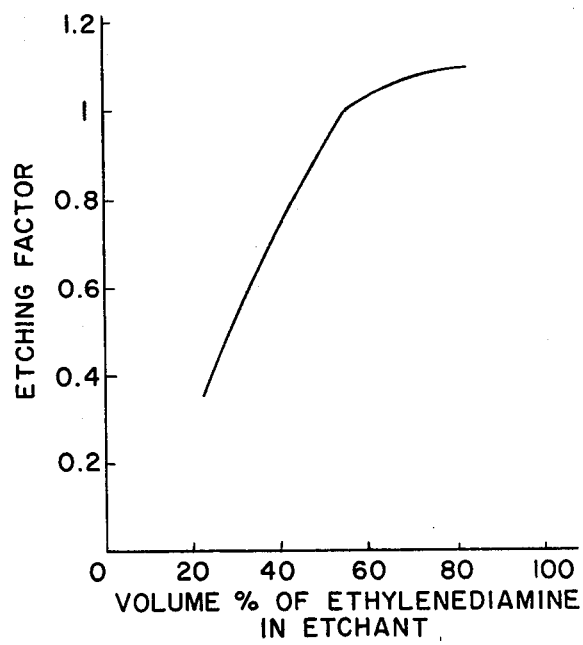
FIG. 6 is a graph showing a relation between an etching factor and a volume % of one constituent in the etchant of the present invention.

As apparent from FIG. 6, the etching factor becomes about 1 when the volume % of ethylenediamine is between about 55% and about 60%, and the higher the volume % of ethylenediamine becomes, the more the slope becomes gentle.

After the polymer resin film, which is in the semicured state, was etched, it is preferable to completely polymerize the polymer resin film. For example, the PIQ resin film or the polyimide film is utilized as the polymer resin film, it is preferable to completely cure the semicured PIQ resin film or the semicured polyimide film at a temperature higher than about 250° C.

Openings formed according to the present invention sustain their shapes even after the polymer resin film is cured, but openings formed by utilizing the etchant consisting of hydrazine do not sustain their shapes since the swelled portion is not thermally stable.

According to the present invention, the polymer resin film may be immersed in the etchant consisting of hydrazine before it is etched by the etchant of the present invention for reducing the time period of etching. The immersion time of the polymer resin film in the etchant consisting of hydrazine should be decided so as the resin film is not etched by the etchant. The range of the time period should be between a time that the swelling of the polymer resin film begins and a time that the thickness of the polymer resin film begins to reduce. These times can easily be understood from the curve f in FIG. 1. The preferable immersion time is about 3 or 4 minutes for the PIQ resin film and the polyimide resin film.

Though the etchant consisting of hydrazine hydrate (80% aqueous solution) and ethylenediamine is mainly described hereinabove, the hydrazine hydrate (80% aqueous solution) may be substituted by hydrazine hydrate (100%), hydrazine hydrate (85% aqueous solution), or other aqueous hydrazine hydrate.

To the etchant of the present invention, water whose volume % is less than 40% may be added.

In the description stated hereinbefore, the proper conditions in the present invention are as follows: the semicuring temperature of polymer resin ranges from 200° C. to 250° C., the volume % of polyamine in the etchant is between 50% and 90%, the etchant temperature ranges from 20° C. to 30° C., and the volume % of water contained in the etchant is less than 40%.

However, in the case that the polymer resin is cured, in the temperature range from 260° C. to 450° C., prior to etching, the present invention has also an almost same advantage as the above. In this case, the proper conditions are as follows: the curing temperature of polymer resin ranges from 260° C. to 450° C., the volume % of polyamine in the etchant is between 30% and 50%, the etchant temperature ranges from 25° C. to 35° C., and the volume % of water contained in the etchant is less than 10% and preferably less than 5%. When such high temperature as mentioned above is used for curing polymer resin, the etching procedure becomes easy because the curing temperature dependence on the etching rate is very low.

Figure 10:
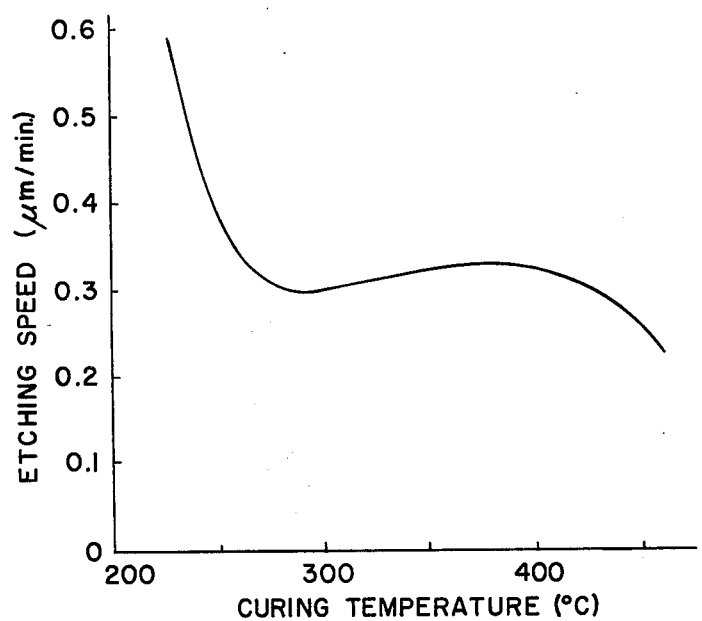
FIG. 10 is a graph showing a relation between an etching speed and a curing temperature of the PIQ resin layer.

FIG. 10 is a graph showing the results of experiments wherein the etching speed was measured for a number of curing temperatures of the PIQ resin layer. This PIQ resin, as well as those used in the experiments producing FIGS. 11-13, was produced by the process disclosed in the aforementioned Japanese Pat. No. 702,696. In this case, the etchant, which contains 30 volume % of ethylenediamine and balance hydrazine hydrate (100% solution) and the temperature of which is about 30° C., was effected onto PIQ films which were cured at various temperatures. As apparent from FIG. 10, it is advantageous to cure the polymer resin layer at the temperature ranging from 260° C. to 450° C. before etching, because of very low curing temperature dependency of etching speed, namely, very low fluctuation of the etching speed due to the curing temperature variation.

Figure 11:
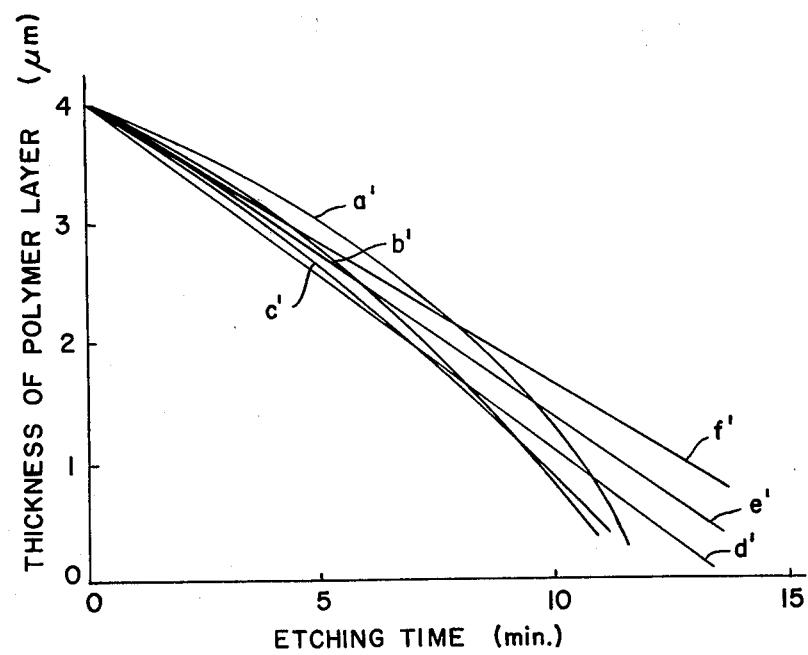
FIG. 11 is a graph showing etching characteristics of several etchants.

FIG. 11 shows results of experiments wherein several etchants were effected onto PIQ films which were cured at 350° C., and thicknesses of the films were measured at every time period. In this case, the etchant temperature was about 30° C. and the volume % of ethylenediamine in the etchants, which contained ethylenediamine and hydrazine hydrate (100% solution), were 0, 10, 20, 30, 40 and 50%. In FIG. 11, the vertical axis represents the thickness of the PIQ film and the horizontal axis represents the etching time. In addition, curves a', b', c', d', e' and f' correspond to the cases of etchants having the volume % of ethylenediamine of 0, 10, 20, 30, 40 and 50% respectively. As is seen from FIG. 11, though the relation between the PIQ film thickness and the etching time is not linear but convex when the volume % of ethylenediamine is less than 20%, it is linear when the volume % of ethylenediamine is between 30% and 50%. In the former case, it is difficult to control the etching procedure because of the nonlinear relation between the film thickness and the etching time, and the etching behavior itself is unstable. Accordingly, the etchant having less than 20 volume % of ethylenediamine is unsuitable for the method of the present invention. However, in the latter case, the controlling of the etching procedure is very easy because of the linear relation between the PIQ film thickness and the etching time. Further, in case of the etchant containing more than 50 volume % of ethylenediamine, the photoresist may peel off undesirably.

Figure 12:
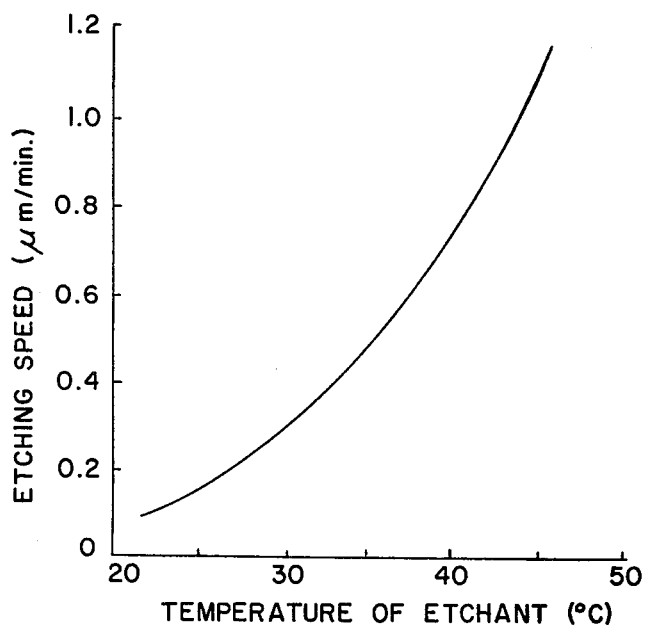
FIG. 12 is a graph showing a relation between an etching speed and an etchant temperature.

FIG. 12 is a graph showing the results of experiments wherein the etching speed was measured for a number of etchant temperatures. In this case, the etchants, which contain 30 volume % of ethylenediamine and balance hydrazine hydrate (100% solution) and have various temperatures, were effected onto PIQ films which were cured at 350° C. The etchant temperature may range from 25° C. to 35° C. The etching speed is too high and the control of the etching speed becomes difficult when the etchant temperature is higher than 35° C., and the etching time becomes very long disadvantageously when the etchant temperature is lower than 25° C., and both the cases are undesirable.

Figure 13:
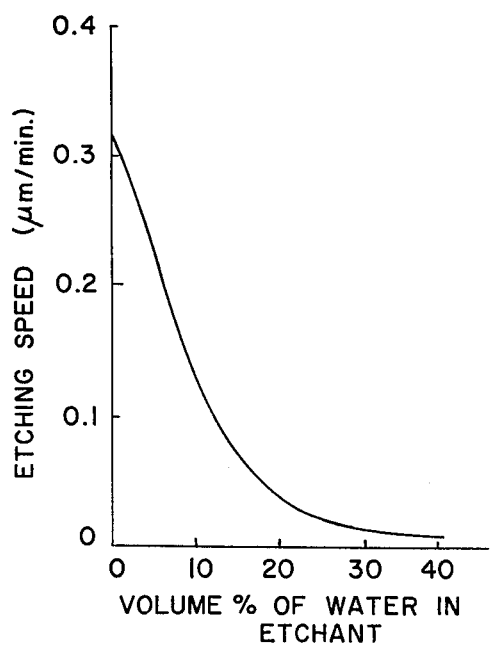
FIG. 13 is a graph showing a relation between an etching speed and a content of water in etchants.

In addition, when water is contained in the etchant, the etching speed lowers very much as seen from FIG. 13, which shows the results of experiments within the etching speed was measured for a number of etchants having differing contents of water in the etchants. In the case of FIG. 13, the volume ratio of ethylenediamine and hydrazine hydrate in the etchants was 3:7, the etchant temperature was 30° C., and the PIQ films onto which the etchants were effected were cured at 350° C. From the practical viewpoint, the volume % of water contained in the etchant should be less than 10% and preferably less than 5%.

The present invention will be more apparent from the following preferred embodiments.

EMBODIMENT 1

Following prepolymers A, B and C are prepared:
A: Pyre-ML, RC 5057 (Trade name of E. I. du Pont de Nemours and Company);
B: Torayniece (Trade name of Toray Kabushikikaisha); and
C: Prepolymer solution of PIQ resin which was obtained by a reaction of diaminodiphenylether-3-carbonamide, diaminodiphenylether, pyromellitic acid and 3,3',4,4'-benzophenone tetracarboxylic acid dianhydride in N-methyl-2-pyrrolidone. (This method is described in detail in Japanese Pat. No. 702,696).

Viscosities of the prepolymers A and B are controlled to 600 cp by adding N-methyl-2-pyrrolidone, and the prepolymer C is controlled so as to have a concentration of 13% and a viscosity of 800 cp.

Each of the prepared prepolymers A and B is coated on an oxidized surface of a silicon wafer by a rotor running at about 4000 rpm, and the prepolymer C is coated on an oxidized surface of a silicon wafer by a rotor running at about 6000 rpm. Resultant members then are dried at a temperature of about 100° C. for 40 minutes for evaporating most of solvents, and are semicured at a temperature of 210° C. for 60 minutes, whereby the prepolymers are dehydrated and closed rings. The thicknesses of semicured polymers are A: 1.03 $\mu$m, B: 0.98 $\mu$m and C: 1.12 $\mu$m.

A solution of a photoresist, which is OMR 83 (Trade name of Tokyo Ohka Kogyo Kabushikikaisha), whose viscosity is 35 cp is applied on each surface of the semicured polymers A, B and C by a rotor running at 5000 rpm. This solution is dried at 90° C. for 20 minutes thereby obtaining a photoresist having a thickness of 6000 Å.

The photoresist is exposed by ultraviolet light through a photomask, and then developed in a developer for OMR 83 for dissolving the unexposed portion of the photoresist, whereby a desired pattern is formed on the photoresist.

An exposed surface of each semicured polymer is immersed in an etchant consisting of 40 volume % of hydrazine hydrate (80% aqueous solution) and 60 volume % of ethylenediamine, whose temperature is 24° C., for 1 minute–1 minute 10 seconds, whereby the semicured polymers are etched.

After the etching of the semicured polymers, the photoresist is removed by immersing the photoresist in a remover J-100 (Trade name of Indust-Ri-Chem, Laboratory Inc.), heated at about 100° C.

Opening sizes at the oxidized surfaces of the silicon wafers are measured and listed on the following Table.

| Pattern Size ($\mu$m$\square$) | Pre-polymer A | Opening Size ($\mu$m$\square$) Prepolymer B | Pre-polymer C |
|---|---|---|---|
| 20 | 19.7–20.1 | 19.8–20.2 | 19.8–20.3 |
| 15 | 14.7–15.3 | 14.6–15.1 | 14.8–15.1 |
| 10 | 9.8–10.3 | 9.9–10.2 | 9.7–10.0 |
| 5 | 4.8–5.1 | 4.8–5.0 | 4.8–5.0 |
| 3 | 2.7–3.0 | 2.8–3.1 | 2.8–3.11 |

Though the openings formed in the semicured polymers have structures such that the farther the distance from the oxidized surface, the wider the opening size, there are no swelled regions at the peripheral portions of the openings and hence the openings have good edge definitions.

As is apparent from the Table, the prepolymers are etched within an error of 0.3 $\mu$m for the thicknesses of 0.98–1.12 $\mu$m and for the pattern sizes of 20 $\mu$m$\square$–3 $\mu$m$\square$.

The etching factors are within the range between 0.89 and 1.08, and the average of the etching factors is 0.97.

When an etchant consisting of hydrazine is applied to the exposed surfaces of the prepolymers, no openings are formed for the pattern sizes of 5 $\mu$m$^{58}$ and 3 $\mu$m$\square$ and openings of different shapes from those of the patterns are formed.

EMBODIMENT 2

The prepolymers A, B and C as in the Embodiment 1 are prepared. Viscosities of these prepolymers are controlled to 1000 cp, and the prepolymers are coated on the oxidized surface of the silicon wafer by the rotor running at about 3000–4000 rpm. The coated prepolymers are dried and semicured at 100° C. for 40 minutes and at 220° C. for 60 minutes, respectively. Thicknesses of the semicured polymers are A: 2.97 $\mu$m, B: 2.90 $\mu$m and C: 3.05 $\mu$m.

The photoresists are formed on the surfaces of the semicured polymers and the patterns are formed on the photoresists as in the Embodiment 1.

Exposed surfaces of the semicured polymers are immersed in an etchant consisting of 60 volume % of hydrazine hydrate (80% aqueous solution) and 40 volume % of ethylenediamine, whose temperature is 24° C., for 7 minutes 30 seconds–8 minutes whereby the prepolymers are etched.

The semicured polymers are etched within an error of 0.3 $\mu$m for the pattern sizes of 20 $\mu$m$\square$, 15 $\mu$m$\square$ and 10 $\mu$m$\square$. Opening sizes for the pattern sizes of 5 $\mu$m$\square$ and 3 $\mu$m$\square$ are 4.5 $\mu$m$\square$ and 2.3 $\mu$m$\square$, respectively.

The etching factors are within the range between 0.70 and 0.78, and are smaller than those obtained in the Embodiment 1.

When an etchant consisting of hydrazine hydrate is applied to the exposed surfaces of the semicured polymers, no openings are formed for the pattern sizes of 10 $\mu$m$\square$, 5 $\mu$m$\square$ and 3 $\mu$m$\square$.

EMBODIMENT 3

The prepolymers A, B and C as in the Embodiment 1 are prepared. Viscosities of these prepolymers are controlled to 1500 cp. These prepolymers are coated, dried and semicured as in the Embodiment 2. Thicknesses of the semicured polymers are 4.8–5.1 $\mu$m.

Photoresists and patterns are formed as in the Embodiment 1.

Exposed surfaces of the semicured polymers are immersed in an etchant consisting of 80 volume % of hydrazine hydrate (80% aqueous solution) and 20 volume % of ethylenediamine, whose temperature is 24° C., for 16 minutes–16 minutes 30 seconds.

The semicured polymers are etched within an error of 0.3 $\mu$m for the pattern sizes of 20 $\mu$m$\square$ and 15 $\mu$m$\square$. Opening sizes for the pattern size of 10 $\mu$m$\square$ are in the range of 8.3 $\mu$m$\square$–9.5 $\mu$m$\square$.

The etching factors are within the range between 0.33–0.36. The slopes of the openings become very gentle. This gentle slope is an advantage for wirings disposed on thick polymer resin layers, since the steps of thick polymer resin layers are eased and hence snappings of wirings are reduced.

EMBODIMENT 4

The prepolymers A, B and C as in the Embodiment 1 are prepared. Viscosities of these prepolymers are controlled to 1000 cp. These prepolymers are coated on the oxidized surface of the silicon wafer by the rotor running at 5000 rpm, and then dried and semicured as in the Embodiment 1. Thicknesses of the prepolymers are A: 2.03 $\mu$m, B: 1.98 $\mu$m and C: 2.10 $\mu$m.

Photoresists and patterns are formed as in the Embodiment 1.

Exposed surfaces of the prepolymers are contacted with an etchant consisting of 20 volume % of hydrazine hydrate (80% aqueous solution) and 80 volume % of ethylenediamine, whose temperature is 24° C., for 3 minutes 40 seconds–3 minutes 50 seconds.

The prepolymers are etched in an accuracy as in the Embodiment 1.

EMBODIMENT 5

Semicured polymers and photoresists are formed as in the embodiment 4, and patterns are formed as in the Embodiment 1.

Exposed surfaces of the semicured polymers are contacted with an etchant consisting of 40 volume % of hydrazine hydrate (80% aqueous solution) and 60 volume % of triethylenetetramine, for 7 minutes–7 minutes, 15 seconds.

The openings are formed within an error which is almost the same as in the Embodiment 2.

EMBODIMENT 6

Semicured polymers and photoresists are formed, and patterns are formed as in the Embodiment 1.

Exposed surfaces of the semicured polymers are immersed in an etchant consisting of 40 volume % of hydrazine hydrate (80% aqueous solution) and 60 volume % of hexamethylenediamine, whose temperature is 24° C., for 3 minutes.

The openings are formed within an error as in the Embodiment 1.

EMBODIMENT 7

Semicured polymers, photoresists and patterns are formed as in the Embodiment 1.

An etchant consisting of 40 volume % of hydrazine hydrate (80% aqueous solution) and 60 volume % of trimethylenediamine, whose temperature is 24° C., is contacted to the exposed surfaces of the semicured polymers for 3 minutes 30 seconds.

The semicured polymers are etched in an accuracy as in the Embodiment 1.

EMBODIMENT 8

Semicured polymers are formed as in the Embodiment 3 so that the thicknesses of the semicured polymers are 6.1 $\mu$m–6.3 $\mu$m, and then photoresists and patterns are formed as in the Embodiment 1.

Exposed surfaces of the semicured polymers are immersed in a first etchant consisting of 80 volume % of hydrazine hydrate (80% aqueous solution) and 20 volume % of H$_2$O, for 4 minutes. After the first etchant is put away, a second etchant consisting of 40 volume % of hydrazine hydrate (80% aqueous solution) and 60 volume % of ethylenediamine, whose temperature is 24° C., is contacted to the exposed surface of the prepolymers, for 5 minutes–5 minutes 20 seconds.

The semicured polymers are etched within an error of 0.5 $\mu$m for the patterns of 20 $\mu$m$^\square$ and 15 $\mu$m$^\square$. The etching factors are within the range between 0.91 and 0.77.

According to this embodiment, an etching time period becomes shorter than that of the case in which only the second etchant is utilized. The etching time period of this embodiment is about 9 minutes, and that of the case in which only the second etchant is utilized is about 12 minutes.

When the etchant consisting of hydrazine hydrate is applied to the exposed surfaces of the semicured polymers of this embodiment, not only an etching time period becomes 27–28 minutes, but also no openings are formed for the pattern sizes less than 30 $\mu$m.

EMBODIMENT 9

FIGS. 7a to 7d are sectional views of semiconductor devices, that is, a planar type transistor, for explaining a method of the present invention.

Figure 7A:
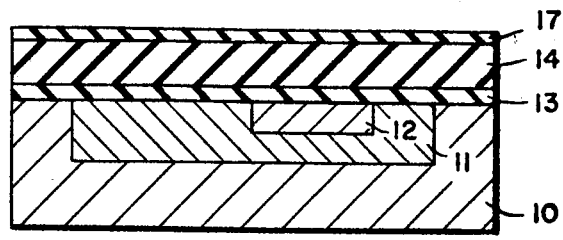
FIGS. 7a to 7d are sectional views of semiconductor devices for explaining one embodiment of the present invention.
Figure 7B:
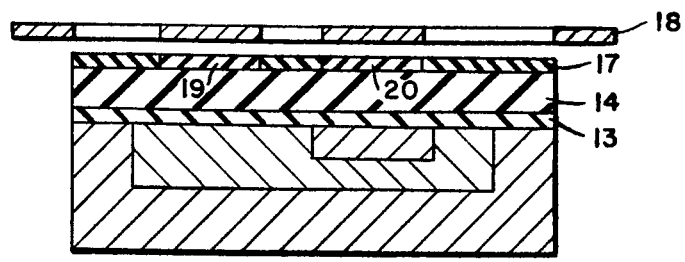
Figure 7C:
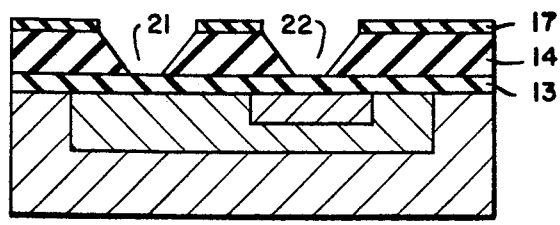
Figure 7D:
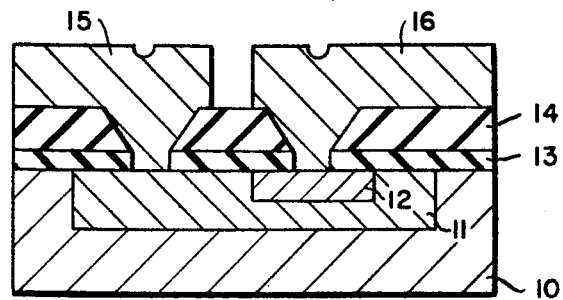

In FIG. 7d, reference numeral 10 designates an n-type Si body which acts as a collector of the transistor, in which a first semiconductor region 11 of p-type is disposed, which acts as a base of the transistor. Reference numeral 12 designates a second semiconductor region of n-type disposed in the first semiconductor region 11, which acts as an emitter of the transistor and reference numeral 13 designates an SiO$_2$ layer disposed on the surface of the Si body 10, on which a PIQ resin layer 14 having a thickness of 3 $\mu$m is disposed. A base electrode 15 penetrates the PIQ resin layer 14 and the SiO$_2$ layer 13 to contact with the first semiconductor region 11. Reference numeral 16 designates an emitter electrode penetrating the PIQ resin layer 14 and the SiO$_2$ layer 13 to contact with the second semiconductor region 12.

This transistor is fabricated by preparing the Si body 10 of n-type, diffusing boron into the body 10 for forming the first region 11, which acts as the base, diffusing phosphorus into the first semiconductor region 11 for forming the second semiconductor region 12, which acts as the emitter, forming the SiO$_2$ layer 13 on the surface of the body 10, forming a layer 14 of semicured polymer of the PIQ resin having a thickness of 3 $\mu$m on the surface of the SiO$_2$ layer 13 as described in the Embodiment 2, forming a photoresist layer 17 on the surface of the semicured polymer layer 14 (FIG. 7a), exposing the photoresist by ultraviolet light through a photomask 18 (FIG. 7b), developing the photoresist for removing unexposed portions 19 and 20 of the photoresist, coating an etchant consisting of 60 volume % of hydrazine hydrate (80% aqueous solution) and 40 volume % of ethylenediamine, whose temperature is 24° C., to the exposed surfaces of the prepolymer layer 14, for 2 minutes 15 seconds, thereby forming openings 21 and 22 through the prepolymer layer 14, removing the photoresist layer 17, forming apertures in the SiO$_2$ layer 13 for exposing the surfaces of a part of the first semiconductor region 11 and a part of the second semiconductor region 12, curing the prepolymer layer of the PIQ resin at a temperature of 260° C. for 2 hours, and forming metal layers 15 and 16 so that one part thereof is connected to each of the first and second semiconductor regions 11 and 12 and other part thereof extends on the surface of the PIQ resin layer 14.

EMBODIMENT 10

FIGS. 8a to 8f are sectional views of semiconductor devices having multi-layered wirings for explaining another embodiment of the present invention.

Figure 8A:
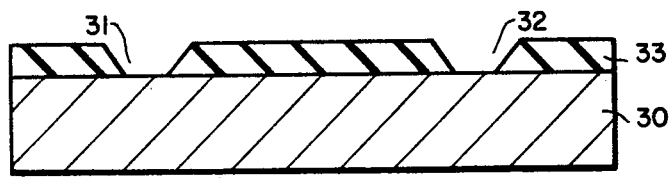
FIGS. 8a to 8f are sectional views of semiconductor devices for explaining another embodiment of the present invention.
Figure 8B:
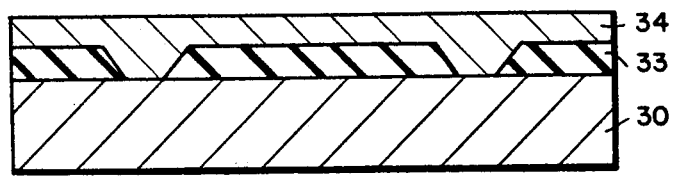
Figure 8C:
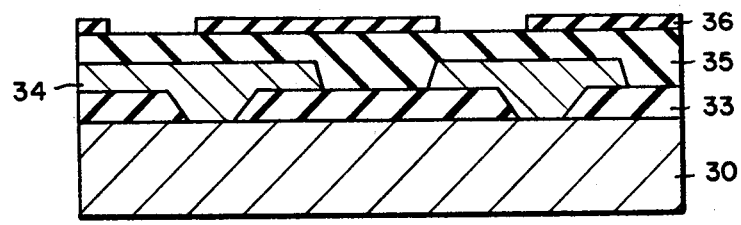
Figure 8D:
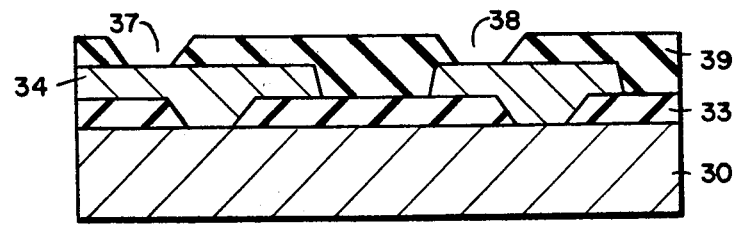
Figure 8E:
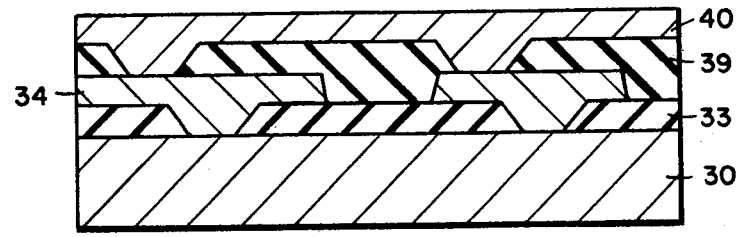
Figure 8F:
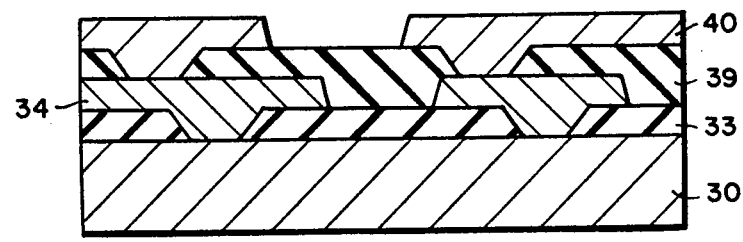

On a semiconductor body 30 in which semiconductor circuit elements are disposed (not shown), a layer of prepolymer of the PIQ resin is formed as described in the Embodiment 1. A photoresist layer and patterns are formed on the semicured polymer layer as in the Embodiment 1. An etchant consisting of 40 volume % of hydrazine hydrate (80% aqueous solution) and 60 volume % of trimethylenediamine, whose temperature is 24° C., is contacted to the exposed surfaces of the prepolymer layer for selectively etching the prepolymer layer, for 3 minutes 30 seconds, whereby openings 31 and 32 are formed through the semicured polymer layer. Then, the semicured polymer layer is completely cured to obtain a first PIQ resin layer 33. (FIG. 8a). A first metal layer 34 is formed on the first PIQ resin layer 33 and also on the exposed surfaces of the body 30 as shown in FIG. 8b. Desired portions of the first metal layer 33 are etched so as to expose the surfaces of the first PIQ resin layer 33 and another layer 35 of semicured polymer of the PIQ resin is formed on the surfaces of the first metal layer 34 and on the exposed surfaces of the first PIQ resin layer 33. A photoresist layer 36 is formed on said another semicured polymer layer 35 and patterns are formed by the method as described in the Embodiment 9. (FIG. 8c). An etchant consisting of 40 volume % of hydrazine hydrate (80% aqueous solution) and 60 volume % of ethylenediamine, whose temperature is 24° C., is contacted to the exposed surfaces of said another semicured polymer layer 35 for 2 minutes for forming openings 37 and 38 as shown in FIG. 8d. The semicured polymer layer 35 is then completely cured at a temperature of 260° C. for 2 hours for obtaining a second PIQ resin layer 39. On the surfaces of the second PIQ layer 39 and the exposed surfaces of the first metal layer, a second metal layer 40 is formed as shown in FIG. 8e. The second metal layer 40 is selectively etched as shown in FIG. 8f, whereby a semiconductor device having a two-level wiring is obtained.

EMBODIMENT 11

Figure 9A:
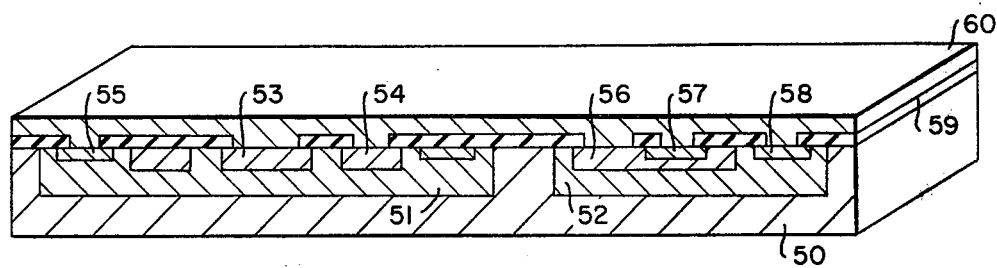
FIGS. 9a to 9d are perspective views of semiconductor devices for explaining a further embodiment of the present invention.
Figure 9B:
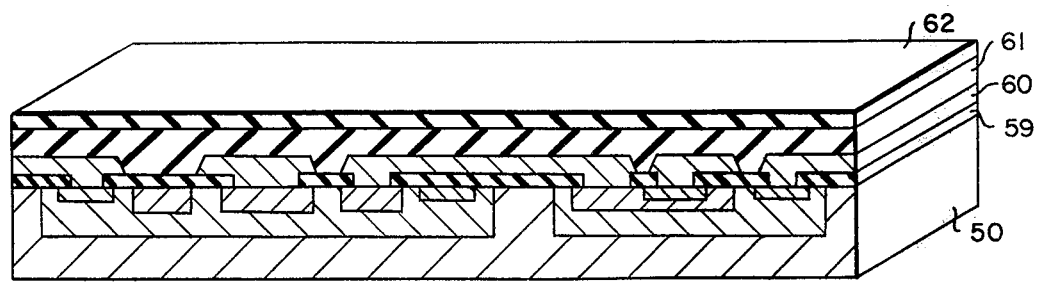
Figure 9C:
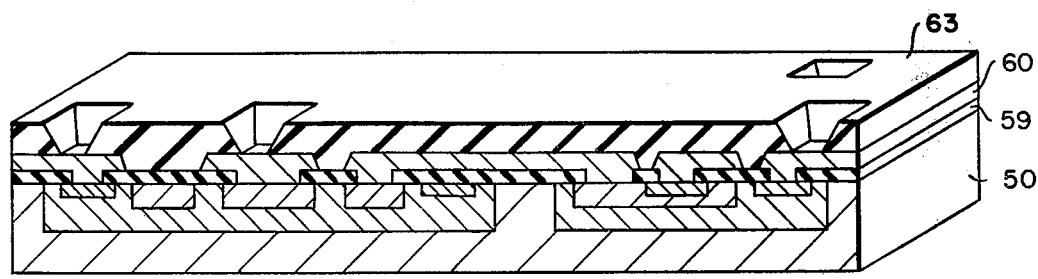
Figure 9D:
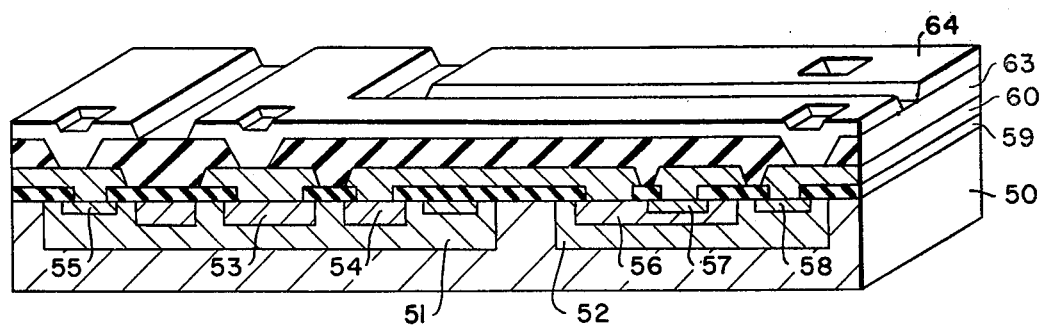

FIGS. 9a and 9d are perspective views of semiconductor devices, complementary lateral transistors, for explaining further embodiment of the present invention.

In a p-type Si body 50, a first n-type region 51 and a second n-type region 52 are formed. In the first n-type region 51, a first p-type region 53, a second p-type region 54 which encircles the first p-type region 53 and a third n-type region 55 which encircles the second p-type region 54 are formed, and in the second n-type region 52, a third p-type region 56 in which a fourth n-type region is disposed and a fifth n-type region 58 are formed. The first p-type region 53, the first n-type region 51, the second p-type region 54 and the third n-type region 55 act as an emitter, a base, a collector and an output terminal for base of a first transistor, respectively, and the fourth n-type region 57, the third p-type region 56, the second n-type region 52 and the fifth n-type region 58 act, respectively, as an emitter, a base, a collector and an output for collector of a second transistor. An SiO$_2$ layer 59 is formed on the surface of the body 50, and selectively etched for exposing surface portions of the first p-type region 53, the second p-type region 54, the third n-type region 55, the third p-type region region 56, the fourth n-type region 57 and the fifth n-type region 58. On the exposed surfaces of the semiconductor regions and the surfaces of the SiO$_2$ layer 59, a first metal layer 60 is formed. (FIG. 9a). The first metal layer 60 is selectively etched so as to obtain desired wirings. On the surfaces of the first metal layer 60 and the exposed surfaces of the SiO$_2$ layer 59, a layer 61 of the semicured PIQ resin is formed by the method as described in the Embodiment 4. A photoresist layer 62 is formed on the surface of the semicured polymer layer 61 (FIG. 9b) and patterns are formed by the method as described in the Embodiment 1. An etchant consisting of 20 volume % of hydrazine hydrate (80% aqueous solution) and 80 volume % of ethylenediamine, which is kept at 24° C., is contacted to the exposed surfaces of the semicured polymer layer 61 for 2 minutes so as to etch the semicured polymer layer 61 and to expose desired surface portions of the first metal layer 60. Then the semicured PIQ resin is completely cured at a temperature of 280° C. for 2 hours for obtaining a PIQ resin layer 63. (FIG. 9c). A second metal layer 64 is formed on the surface of the PIQ resin layer 63 and exposed surfaces of the first metal layer 60, and desired portions of the second metal layer 64 are etched to obtain desired wirings, whereby the complementary lateral transistor is fabricated. (FIG. 9d).

Although the preferred embodiments of the present invention have been described above, the present invention is not limited to those embodiments.

For example, although the etchant consisting of hydrazine hydrate and one of polyamines shown by a chemical formula of:

NH$_2$.R.NH$_2$, wherein R is selected from divalent radicals having 2–6 carbon atoms, is utilized for etching polymer resin layers, it may be utilized for the present invention that an etchant consisting of hydrazine, a first polyamine and a second polyamine which is different from the first polyamine, each polyamine being shown by a chemical formula of:

NH$_2$.R.NH$_2$, wherein R is selected from divalent radicals having 2–6 carbon atoms.

Further, although, in the Embodiment 8, the polymer resin layer is etched by the first etchant consisting of hydrazine hydrate and by the second etchant consisting of hydrazine hydrate and ethylenediamine, an etchant consisting of at least one of polyamines shown by a chemical formula of:

NH$_2$.R.NH$_2$, wherein R is selected from divalent radicals having 2–6 carbon atoms may be utilized as the second etchant.

Further, although, in the Embodiment 10, a semiconductor material is utilized for the body, insulating materials may be utilized for the body.

Furthermore, though, in the embodiments, prepared prepolymers coated on the oxidized surface are dried at a temperature of 100° C. for 40 minutes, and dried prepolymers are semicured at a temperature of 210° C. for 60 minutes or of 220° C. for 60 minutes; it is preferable in the present invention that the temperature and time period for drying are between 80° C. and 150° C., and more than 10 minutes, respectively and that the temperature and time period for semicuring are between 200° C. and 250° C. and more than 10 minutes, respectively; it is also preferable that no heat treatment is done for drying and only a heat treatment for semicuring at a temperature between 200° C. and 250° C. for more than 10 minutes is done; it is more preferable that the heat treatment at a temperature between 90° C. and 110° C. for more than 10 minutes for drying and the heat treatment at a temperature between 210° C. and 230° C. for more than 10 minutes for semicuring; and it is most preferable that the heat treatment for drying at a temperature of 100° C. for between 30 minutes and 60 minutes and the heat treatment for semicuring at a temperature of 220° C. for between 30 minutes and 60 minutes.

EMBODIMENT 12

In addition, the almost same results as mentioned in the above Embodiments are obtained when the curing temperature of the polymer resins (as described previously in Embodiment 1) before etching, the volume % of polyamine in the etchant, the etchant temperature, and the volume % of water in the etchant were changed to 260°–450° C., 30–50%, 25°–35° C. and less than 10% respectively.

While the present invention has been shown and described in terms of the best mode contemplated for carrying out the invention, it will be appreciated that changes and modifications can be made which do not depart from the inventive concepts taught herein. Such changes and modifications are deemed to be within the purview of the present invention.

What is claimed is:

1. A method for fabricating a semiconductor device comprising the steps of:
    forming, on a body, a layer of cured polymer resin selected from the group consisting of polyimide and polyimide-iso-indroquinazolinedione and cured at 260°–450° C.; and
    contacting an etchant consisting essentially of hydrazine or hydrazine hydrate and at least one polyamine shown by a chemical formula of $NH_2.R.NH_2$ wherein R is selected from divalent radicals having 2–6 carbon atoms, the temperature of said etchant being in a range from 25° C. to 35° C., to a prescribed portion of said cured layer so as to form an opening at said prescribed portion.

2. A method for fabricating a semiconductor device according to claim 1, wherein the volume % of said at least one polyamine in said etchant is between 30% and 50%.

3. A method for fabricating a semiconductor device according to claim 1, wherein the cured polymer resin layer is a cured polyimide resin layer.

4. A method for fabricating a semiconductor device according to claim 1, wherein the cured polymer resin layer is a cured polyimide-iso-indroquinazolinedione resin layer.

5. A method for fabricating a semiconductor device according to claim 1, wherein said etchant consists essentially of hydrazine and polyamine shown by a chemical formula of $NH_2.R.NH_2$ wherein R is selected from divalent radicals having 2–6 carbon atoms.

6. A method for fabricating a semiconductor device according to claim 5, wherein the volume % of said polyamine in said etchant is between 30% and 50%.

7. A method for fabricating a semiconductor device according to claim 6, wherein said polyamine is ethylenediamine.

8. A method for fabricating a semiconductor device according to claim 5, wherein said polyamine is selected from the group consisting of ethylenediamine, trimethylenediamine, tetramethylenediamine, pentamethylenediamine and hexamethylenediamine.

9. A method for fabricating a semiconductor device according to claim 8, wherein said polyamine is ethylenediamine.

10. A method for fabricating a semiconductor device according to claim 5, wherein said etchant consists of an aqueous solution of hydrazine and polyamine shown by a chemical formula of:

$NH_2.R.NH_2$ wherein R is selected from divalent radicals having 2–6 carbon atoms, said solution containing more than 90 volume % of hydrazine and polyamine, balance water.

11. A method for fabricating a semiconductor device according to claim 10, wherein said polyamine is selected from the group consisting of ethylenediamine, trimethylenediamine, tetramethylenediamine, pentamethylenediamine and hexamethylenediamine.

12. A method for fabricating a semiconductor device according to claim 11, wherein said polaymine is ethylenediamine.

13. A method for fabricating a semiconductor device according to claim 10, wherein the volume % of said polyamine is between 30% and 50%.

14. A method for fabricating a semiconductor device according to claim 10, wherein said solution contains more than 95 volume % of hydrazine and polyamine, balance water.

15. A method for fabricating a semiconductor device according to claim 1, wherein said etchant consists of an aqueous solution of hydrazine and at least one polyamine shown by a chemical formula of $NH_2.R.NH_2$ wherein R is selected from divalent radicals having 2–6 carbon atoms, said solution containing more than 90 volume % of hydrazine and polyamine, balance water.

16. A method for fabricating a semiconductor device according to claim 15, wherein said solution contains more than 95 volume % of hydrazine and polyamine, balance water.

17. A method for fabricating a semiconductor device according to claim 15, wherein the volume % of said at least one polyamine is between 30% and 50%.

18. A method for fabricating a semiconductor device according to claim 15, wherein said at least one polyamine is selected from the group consisting of ethylenediamine, trimethylenediamine, tetramethylenediamine, petamethylenediamine and hexamethylenediamine.

19. A method for fabricating a semiconductor device according to claim 18, wherein said at least one polaymine is ethylenediamine.

20. A method for fabricating a semiconductor device comprising the steps of:

forming at least one circuit element in a semiconductor body;
forming an insulating layer on the surface of said body;
forming at least one opening at prescribed portions of said insulating layer for exposing at least one prescribed surface of said circuit element
forming a metal layer on the surface of said at least one surface and on said exposed at least one surface of said circuit element;
selectively etching said metal layer for forming a prescribed pattern of said metal layer, whereby prescribed surfaces of said insulating layer are exposed;
forming a layer of cured polymer resin selected from the group consisting of polyimide and polyimide-iso-indroquinazolinedione and cured at 260°–450° C., on the surfaces of said metal layer and exposed surfaces of said insulating layer;
forming a photoresist layer on the surface of said cured polymer resin layer;
forming a prescribed pattern on said photoresist layer, so that prescribed surfaces of said cured polymer layer are exposed;
contacting an etchant consisting essentially of hydrazine or hydrazine hydrate and polyamine shown by a chemical formula of $NH_2.R.NH_2$

wherein R is selected from divalent radicals having 2–6 carbon atoms, the temperature of said etchant being in a range from 25° C. to 35° C., to the exposed surface of said polymer layer, so as to etch said polymer layer and to expose prescribed surfaces of said metal layer;
removing said photoresist layer;
forming another metal layer on the surface of said cured polymer resin layer and exposed surface of said metal layer; and
etching said another metal layer so as to form a prescribed pattern.

21. A method for fabricating a semiconductor device according to claim 20, wherein the cured polymer resin layer is a cured polyimide-iso-indroquinazolinedione resin layer.

22. A method for fabricating a semiconductor device according to claim 20, wherein the cured polymer resin layer is a cured polyimide resin layer.

23. A method for fabricating a semiconductor device according to claim 20, wherein the volume % of said polyamine is between 30% and 50%.

24. A method for fabricating a semiconductor device comprising the steps of:
forming an insulating layer on a surface of a body;
forming a layer of cured polymer resin selected from the group consisting of polyimide and polyimide-iso-indroquinazolinedione and cured at 260°–450° C., on the surface of said insulating layer;
forming a photoresist layer on the surface of said cured polymer layer;
forming a prescribed pattern on said photoresist layer, so that prescribed surfaces of said cured polymer layer are exposed;
contacting an etchant consisting essentially of hydrazine or hydrazine hydrate and polyamine shown by a chemical formula of $NH_2.R.NH_2$

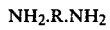

wherein R is selected from divalent radicals having 2–6 carbon atoms, the temperature of said etchant being in a range from 25° C. to 35° C., to the exposed surface of said polymer layer, so as to etch said polymer layer and to expose prescribed surfaces of said insulating layer;
removing said photoresist layer;
etching said insulating layer;
forming a metal layer on said cured polymer resin layer; and
etching said metal layer so as to form a prescribed pattern.

25. A method for fabricating a semiconductor device according to claim 24, wherein the volume % of said polyamine is between 30% and 50%.

26. A method for fabricating a semiconductor device according to claim 24, wherein the cured polymer resin layer is a cured polyimide-iso-indroquinazolinedione resin layer.

27. A method for fabricating a semiconductor device according to claim 24, wherein the cured polymer resin layer is a cured polyimide resin layer.

28. A method for fabricating a semiconductor device comprising the steps of:
forming a first metal layer on an insulating layer;
etching said metal layer so as to form a prescribed pattern;
forming a layer of cured polymer resin selected from the group consisting of polyimide and polyimide-iso-indroquinazolinedione and cured at 260°–450° C., on the surface of said prescribed pattern and on exposed surfaces of said insulating layer;
contacting an etchant consisting essentially of hydrazine or hydrazine hydrate and polyamine shown by a chemical formula of $NH_2.R.NH_2$

wherein R is selected from divalent radicals having 2–6 carbon atoms, the temperature of said etchant being in a range from 25° C. to 35° C. at prescribed portions of said cured polymer layer, so as to etch said prescribed portions of said cured polymer layer and to expose surfaces of the first metal layer;
forming a second metal layer on said cured polymer resin layer and exposed surfaces of said first metal layer; and
etching said second metal layer so as to form a prescribed pattern.

29. A method for fabricating a semiconductor device according to claim 28, wherein the volume % of said polyamine is between 30% and 50%.

30. A method for fabricating a semiconductor device according to claim 28, wherein the cured polymer resin layer is a cured polyimide-iso-indroquinazolinedione resin layer.

31. A method for fabricating a semiconductor device according to claim 28, wherein the cured polymer resin layer is a cured polyimide resin layer.

32. An etchant for a polymer resin selected from the group consisting of polyimide and polyimide-iso-indroquinazolinedione and cured at 260°–450° C., consisting essentially of hydrazine and at least one polyamine shown by a chemical formula of $NH_2.R.NH_2$

wherein R is selected from divalent radicals having 2-6 carbon atoms, with the volume % of said at least one polyamine being between 30% and 50%.

33. An etchant according to claim 32, wherein said at least one polyamine is selected from the group consisting of ethylenediamine, trimethylenediamine, tetramethylenediamine, pentamethylenediamine and hexamethylenediamine.

34. An etchant according to claim 33, wherein said at least one polyamine is ethylenediamine.

35. An etchant for a polymer resin selected from the group consisting of polyimide and polyimide-isoindroquinazolinedione and cured at 260°-450° C., consisting essentially of hydrazine and polyamine shown by a chemical formula of $$NH_2.R.NH_2$$

wherein R is selected from divalent radicals having 2-6 carbon atoms, with the volume % of said polyamine being between 30% and 50%.

36. An etchant according to claim 35, wherein said polyamine is selected from the group consisting of ethylenediamine, trimethylenediamine, tetramethylenediamine, pentamethylenediamine and hexamethylenediamine.

37. An etchant according to claim 36, wherein said polyamine is ethylenediamine.

38. An etchant for a polymer resin selected from the group consisting of polyimide and polyimide-isoindroquinazolinedione and cured at 260°-450° C., consisting essentially of an aqueous solution of hydrazine hydrate and at least one polyamine shown by a chemical formula of $$NH_2.R.NH_2$$

wherein R is selected from divalent radicals having 2-6 carbon atoms, said solution containing more than 90 volume % of hydrazine hydrate and polyamine, balance water.

39. An etchant according to claim 38, wherein said solution contains more than 95 volume % of hydrazine hydrate and polyamine, balance water.

40. An etchant according to claim 38, wherein said at least one polyamine is selected from the group of ethylenediamine, trimethylenediamine, tetramethylenediamine, pentamethylenediamine, and hexamethylenediamine.

41. An etchant according to claim 38, wherein the volume % of said at least one polyamine is between 30% and 50%.

42. An etchant according to claim 38, wherein said at least one polyamine is ethylenediamine.

43. An etchant according to claim 42, wherein the volume % of said at least one polyamine is between 30% and 50%.

44. An etchant for a polymer resin selected from the group consisting of polyimide and polyimide-isoindroquinazolinedione and cured at 260°-450° C., consisting essentially of an aqueous solution of hydrazine hydrate and polyamine shown by a chemical formula of $$NH_2.R.NH_2$$

wherein R is selected from divalent radicals having 2-6 carbon atoms, said solution containing more than 90 volume % of hydrazine hydrate and polyamine, balance water.

45. An etchant according to claim 44, wherein said solution contains more than 95 volume % of hydrazine hydrate and polyamine, balance water.

46. An etchant according to claim 44, wherein said polyamine is selected from the group consisting of ethylenediamine, trimethylenediamine, tetramethylenediamine, pentamethylenediamine and hexamethylenediamine.

47. An etchant according to claim 46, wherein the volume % of said polyamine is between 30% and 50%.

48. An etchant according to claim 46, wherein said polyamine is ethylenediamine.

49. An etchant according to claim 48, wherein the volume % of said ethylenediamine is between 30% and 50%.

* * * * *